United States Patent [19]

Kane

[11] 4,255,514
[45] Mar. 10, 1981

[54] METHOD FOR FABRICATING A DIFFRACTIVE SUBTRACTIVE FILTER EMBOSSING MASTER

[75] Inventor: James Kane, Zumikon, Switzerland

[73] Assignee: RCA Corporation, New York, N.Y.

[21] Appl. No.: 33,828

[22] Filed: Apr. 27, 1979

[51] Int. Cl.³ .............................................. G03C 5/04
[52] U.S. Cl. ................................ 430/320; 350/162 R; 350/162 SF; 350/314; 430/11; 430/16; 430/324; 430/329; 430/330
[58] Field of Search ............. 350/162 R, 162 SF, 311, 350/314, 317, 320; 430/321, 323, 326, 329, 330, 320, 324, 16, 11

[56] References Cited

U.S. PATENT DOCUMENTS

| 3,443,944 | 5/1969 | Wise | 430/324 X |
|---|---|---|---|
| 3,945,825 | 3/1976 | Gale et al. | 430/323 X |
| 3,957,354 | 5/1976 | Knop | 350/162 SF |
| 4,057,326 | 11/1977 | Knop | 350/162 R |
| 4,062,628 | 12/1977 | Gale | 350/162 R |
| 4,108,660 | 8/1978 | Gale et al. | 430/321 |
| 4,130,347 | 12/1978 | Knop | 350/162 R |
| 4,155,627 | 5/1979 | Gale et al. | 350/162 R |

Primary Examiner—John K. Corbin
Assistant Examiner—John D. Lee
Attorney, Agent, or Firm—Samuel Cohen; George J. Seligsohn

[57] ABSTRACT

By flow-melting low-melting point electroplated metal structures, each corresponding to a white-manifesting region of the embossing master, any originally re-entrant shaped structure becomes non-re-entrant. Further, the flow-melting provides a brighter white color capability for the filter embossed in a thermoplastic film.

4 Claims, 2 Drawing Figures

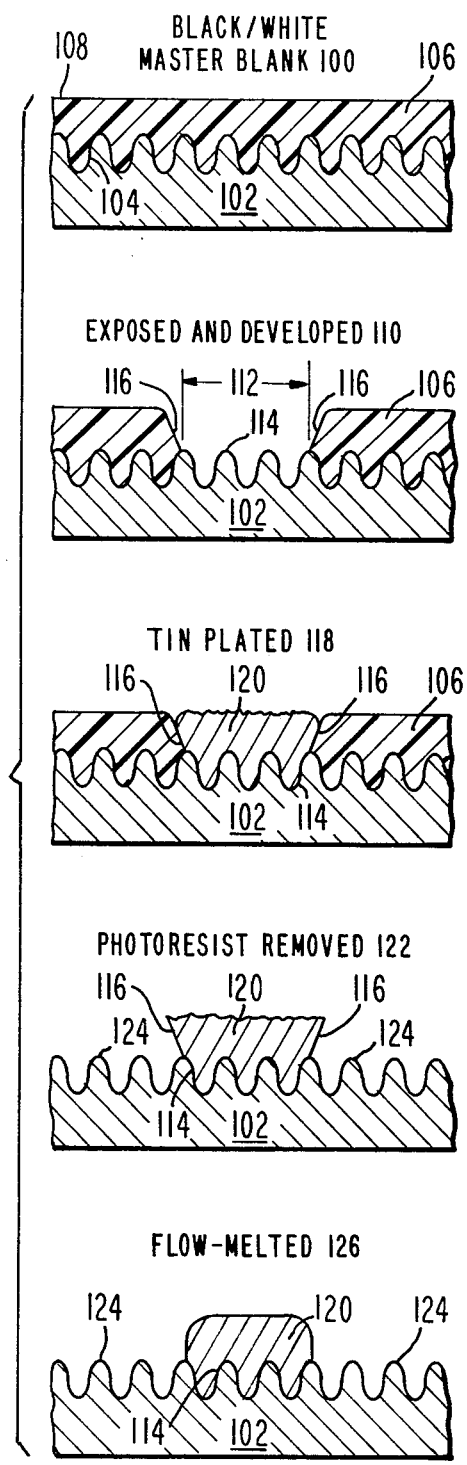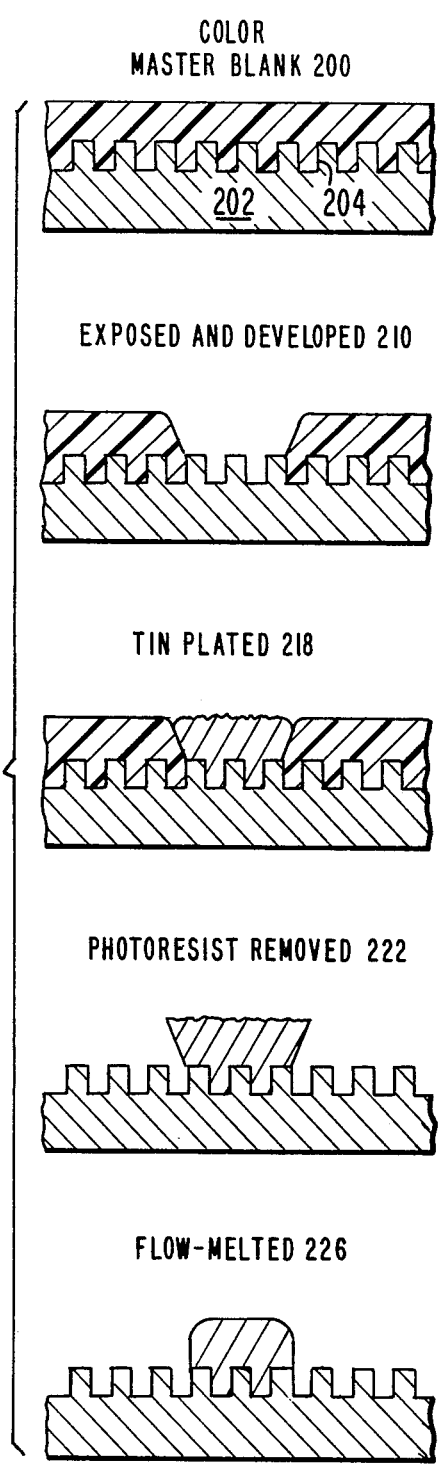
Fig. 1.
Fig. 2.

METHOD FOR FABRICATING A DIFFRACTIVE SUBTRACTIVE FILTER EMBOSSING MASTER

This invention relates to an improved method for fabricating a diffractive subtractive filter embossing master.

Reference is made to U.S. Pat. No. 4,108,660, which issued to Gale and me on Aug. 22, 1978. This patent discloses a method employing a recording blank for fabricating a master to be used for embossing a diffractive subtractive filter, representing certain picture image information defined by a spatial arrangement of contiguous white-manifesting regions and non-white-manifesting regions, into a thermoplastic film. The recording blank comprises a substrate having a given metal surface thereof formed of at least one set of spaced lined ridges defining a diffraction grating of a given profile and depth. The given surface has a photo-resist disposed thereon which fills the spaces between adjacent line ridges and provides a substantially smooth exterior surface. The method disclosed in this patent comprises the steps of (a) exposing the photo-resist to light manifesting the certain picture-image information; (b) removing all the exposed photoresist from solely the white-manifesting regions, thereby to reveal entirely the spaced line ridges of only those portions of the surface of the substrate underlying the white-manifesting regions; (c) leveling solely the revealed portions of the surface of the substrate to obliterate the spaced line ridges of the white-manifesting regions, and (d) then removing all the remaining photoresist to now reveal entirely the spaced line ridges underlying the non-white-manifesting regions of the exposed photoresist. In one specific embodiment of this method, the substrate surface is composed of a metal (e.g. nickel) and the step of leveling is accomplished by electroplating the line ridges of the revealed metal surface with a metal (e.g. nickel).

Usually the photoresist of the master blank is exposed by contact printing image information through a screening mask. Under such circumstances, the ridge profile of the removed (developed) photoresist is sharp, vertical and well-defined. In this case, metal (nickel) plate-up inherently produces a structure suitable for hot embossing into a thermoplastic film.

However, there are circumstances where it is desirable to directly project screen image information onto the nickel master (rather than contact printing the picture information through a screening mask). In this case, the edge portion of each white-manifesting region may be only partially exposed. Therefore, the edge profile of the developed photoresist may be sloped, rather than vertical. The direction of this edge profile slope is such to cause the top of the electroplated metal corresponding to each white-manifesting region to overhang the bottom thereof, which bottom is in contact with the upper surface of the metal substrate. Thus, the electroplated metal corresponding to each white-manifesting region has a re-entrant shape. A re-entrant shape is highly undesirable for an embossing master, because it causes interlocking between the embossing master and the embossed thermoplastic film replica. This not only makes separation of master and replica unnecessarily difficult, but causes local distortion of the embossed grating line ridges in the replica, which, in the case of a color diffractive subtractive filter, cause local variations in color (especially in areas containing fine-screening dots).

In accordance with the principles of the present invention, the electroplated metal is one that has a flow-melt temperature substantially below that of the metal surface of the substrate. This permits an additional step of heating the electroplated metal to a given temperature at least equal to its flow-melt temperature, but below the flow-melt temperature of the metal surface of the substrate. Such heating causes any originally re-entrant shape portions of the electroplated metal to heat flow into a non-re-entrant shape.

In the drawings:

FIG. 1 is a flow diagram showing the successive steps required to fabricate a black/white diffractive subtractive filter master from a black/white master blank in accordance with the principles of the present invention, and FIG. 2 is a flow diagram showing the successive steps required to fabricate a color diffractive subtractive filter master from a color master blank in accordance with the principles of the present invention.

Referring to FIG. 1, there is shown master blank 100, comprising nickel substrate 102 having sinusoidal relief-pattern diffractive structure 104 on the upper surface thereof. Preferably, diffractive structure 104 comprises two angularly-displaced sinusoidal diffraction gratings each having a different depth, in accordance with the teachings of U.S. Pat. No. 4,062,628, which issued Dec. 13, 1977 to Gale. Nickel substrate 102 of master blank 100 is covered with a layer of photoresist 106 having a substantially smooth exterior surface 108.

If surface 108 of master blank 100 is exposed to projected, already-screened image-information light (rather than being exposed by contact printing to image information which passes through a screening (e.g. chrome) mask in direct contact with surface 108), the photoresist will be only partially exposed at the edge of each screening dot. Therefore, as shown in "exposed and developed" step 110, the removed photoresist from white-manifesting region 112, (which reveals entirely the spaced line ridges 114 of the upper surface substrate 102 underlying white-manifesting region 112), is defined by sloping edge profile 116 of the exposed and developed photoresist.

As shown in "tin-plated" step 118, the revealed upper metal surface 114 of substrate 102, underlying each white-manifesting region, is electroplated with another metal, such as tin 120, having a flow-melt temperature below that of the upper metal (i.e., nickel) surface 114 of substrate 102. As shown, the shape of electroplated tin-layer 120 covering each white-manifesting region is defined by sloping edge profile 116.

After the "photoresist remove" step 122, the line ridges of the upper surface 124 of substrate 102 underlying the non-white (i.e., black) regions are now revealed. However, electroplated tin layer 120 effectively levels the line ridges of each white-manifesting region.

Each of steps 110, 118 and 122, performed, in that order, on master blank 100, are generally similar to the method steps disclosed in the aforesaid U.S. Pat. No. 4,108,660. The only significant differences are that the electroplated metal, such as tin, which is used in the present method has a low flow-melt temperature, and the individual electroplated tin layer 120 covering each white-manifesting region has a re-entrant shape defined by sloping edge profile 116.

The additional slope flow-melted step 126 (which is not disclosed in the aforesaid U.S. Pat. No. 4,108,660) reshapes tin layer 120 so that it no longer has a re-entrant shape. This may be accomplished by heating tin layer 120 to a temperature somewhat in excess of 232° C. (the melting point of tin), so that it flow-melts. By way of example, this heating may be accomplished by dipping the entire tin-plated nickel substrate plate in hot oil, at a temperature of about 250° C. for 5–10 seconds. The resulting flow-melting of the tin removes any sharp edge profiles and at the same time produces a "bright" (i.e. very smooth) flat surface, which gives a good "white" in the subsequently embossed diffractive substrative filter. Even for the case where the original edge profile is vertical (so that a re-entrant shape is not a problem), it is desirable to flow-melt the electroplated layer just for the purpose of producing a "bright" flat surface which gives a good "white" in the subsequently embossed diffractive subtractive filter.

It has been found that the removal of all photo-resist prior to flow-melting does not adversely affect resolution, since a thin tin coating has no apparent tendency to spread laterally. The optimum tin thickness, as measured after flow-melting on a grating structure, is about 0.5 μm. Tin coating that is thinner than this optimum does not develop the full "white" when it flow-melts. Tin-plated regions thicker than approximately 1.0 μm tend to "ball-up" on flow-melting, producing small lens like structures in the embossed thermoplastic. These "ball-up" structures may be considered cosmetically undesirable when the embossed thermoplastic film diffractive subtractive filter is viewed in a projector.

FIG. 2 shows the method of the present invention employed in the fabrication of a master for embossing a color diffractive subtractive filter in a thermoplastic. In this case, master blank 200 comprises substrate 202 having a rectangular-wave relief-pattern diffraction grating upper metal (e.g. nickel) surface 204. Upper surface 204 is covered with photoresist layer 206 having a smooth exterior surface 208. The difference between color master blank 200 and black/white master 100 is that upper metal surface 104 of black/white master blank 100 has a sinusoidal profile, while upper metal surface 204 of color master blank 200 has a rectangular-wave profile. As described in more detail in U.S. Pat. No. 3,957,354, which issued May 18, 1976 to Knop and in U.S. Pat. No. 4,130,347, which issued Dec. 19, 1978 to Knop, the illumination with white light of a transmissive color diffractive subtractive filter which has been embossed in a thermoplastic film with a master fabricated from master blank 200, exhibits a color which depends both on the physical depth of the rectangular-wave pattern of upper metal surface 204 and on the index of refraction of the embossed thermoplastic film.

All of the successive method steps of FIG. 2 for fabricating the color embossing master are identical to the corresponding steps of FIG. 1, described above, for fabrication a black/white embossing master. More specifically, "exposed and developed" step 210 corresponds to "exposed and developed" step 110; "tin plated" step 218 corresponds to "tin plated" step 118; "photoresist removed" step 222 corresponds with "photoresist removed" step 122, and "flow-melted" step 226 corresponds with "flow-melted" step 126.

What is claimed is:

1. In a method employing a recording blank for fabricating a master to be used in embossing a diffractive subtractive filter, representing certain picture-image information defined by a spatial arrangement of contiguous white-manifesting regions and non-white manifesting regions, into a thermoplastic film, said recording blank comprising a substrate having a given metal surface thereof formed of at least one set of spaced line ridges defining a diffraction grating of a given profile and depth, said given surface having a photoresist disposed thereon which fills the spaces between adjacent line ridges and provides a substantially smooth exterior surface; said method including the steps of exposing said exterior surface of said photoresist to light manifesting said certain picture-image information, removing exposed photoresist from solely said white-manifesting regions thereby to reveal entirely spaced line ridges of only portions of said surface of said substrate underlying said white-manifesting regions, electroplating a predetermined metal onto said revealed portions of said given metal surface for leveling solely said revealed portions of said given metal surface to obliterate the revealed spaced line ridges of said white-manifesting portions, and then removing all the remaining photoresist to now reveal line ridges of said given metal surface underlying the non-white manifesting regions of said exposed photoresist; the improvement wherein;

said predetermined metal has a flow-melt temperature substantially below that of said given metal surface of said substrate, and wherein said improved method includes the additional step of;

heating said electroplated predetermined metal to a given temperature at least equal to its flow-melt temperature but below the flow-melt temperature of said given metal surface.

2. The method defined in claim 1, wherein said given metal surface is nickel and said predetermined metal is tin and wherein said step of heating said electroplated predetermined metal comprises dipping said master in hot oil having said given temperature for a predetermined time.

3. The method defined in claim 2, wherein said flow-melt temperature of said tin is substantially 232° C., and wherein said step of dipping comprises dipping said master in hot oil having a given temperature in the order of 250° C. for a predetermined time in the range of five to ten seconds.

4. The method defined in claim 1, wherein the step of removing exposed photoresist comprises the step of removing a greater area of photoresist at a portion of the exterior surface thereof corresponding to a white-manifesting region than is removed from the portion of the interior surface of the photoresist in contact with said given metal surface underlying that white-manifesting region, whereby the original shape of said electroplated predetermined metal corresponding to that white-manifesting region is such that the top of said predetermined metal overhangs the bottom thereof in contact with said given metal surface, and wherein said additional step results in the flow of said predetermined metal corresponding to that white-manifesting region changing the shape thereof to reflect the removal of said overhang.

* * * * *